US012618907B2

(12) United States Patent
Savinov et al.

(10) Patent No.: US 12,618,907 B2
(45) Date of Patent: May 5, 2026

(54) METHOD AND DEVICE FOR DETECTING A CRITICAL ANOMALY IN A DEVICE BATTERY BASED ON MACHINE LEARNING METHODS

(71) Applicant: Robert Bosch GmbH, Stuttgart (DE)

(72) Inventors: Alexandr Savinov, Ludwigsburg (DE); Parameswaran Krishnan, Ayalur (IN); Calvin Pfob, Stuttgart (DE); Christian Simonis, Leonberg (DE); Karthikeyan Ramachandran, Bengaluru (IN); Raimund Kaiser, Ditzingen (DE); Tobias Huelsing, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 519 days.

(21) Appl. No.: 18/176,811

(22) Filed: Mar. 1, 2023

(65) Prior Publication Data

US 2023/0280406 A1    Sep. 7, 2023

(30) Foreign Application Priority Data

Mar. 2, 2022    (DE) ...................... 10 2022 202 111.8

(51) Int. Cl.
*G01R 31/367* (2019.01)
*G01R 31/36* (2020.01)
*G01R 31/392* (2019.01)

(52) U.S. Cl.
CPC ....... *G01R 31/367* (2019.01); *G01R 31/3648* (2013.01); *G01R 31/392* (2019.01)

(58) Field of Classification Search
None
See application file for complete search history.

(56) References Cited

U.S. PATENT DOCUMENTS

| | | | |
|---|---|---|---|
| 2015/0072198 A1* | 3/2015 | Fink | G01R 31/396 |
| | | | 429/90 |
| 2016/0109527 A1* | 4/2016 | Drenkelforth | B60L 58/12 |
| | | | 702/63 |
| 2016/0239759 A1* | 8/2016 | Sung | H01M 10/48 |
| 2021/0349157 A1* | 11/2021 | Srinivasan | G01R 31/389 |

* cited by examiner

*Primary Examiner* — Huy Q Phan
*Assistant Examiner* — Carl F.R. Tchatchouang
(74) *Attorney, Agent, or Firm* — Michael Best & Friedrich LLP

(57) ABSTRACT

A method for monitoring a device battery for the presence of an anomaly in the battery operation. In some examples, the method includes providing temporal operational variable profiles of operational variables for the device battery; determining an input dataset of operational characteristics for a historical evaluation period as a function of the temporal operational variable profiles; and using an anomaly detection model with an encoder/decoder model to determine a reconstruction error for the input dataset. The encoder/decoder model is trained with input datasets of device batteries of normal function to map an input dataset onto an input dataset that is reconstructed as identically as possible. When a reconstruction error is found, a rule-based criticality value is determined as a function of one or more characteristic-based criticality values. An error type is also signaled.

8 Claims, 3 Drawing Sheets

METHOD AND DEVICE FOR DETECTING A CRITICAL ANOMALY IN A DEVICE BATTERY BASED ON MACHINE LEARNING METHODS

BACKGROUND OF THE INVENTION

The invention relates to device batteries for use in technical devices as well as to methods for detecting an anomaly in device batteries. The invention further relates to a method for assessing a criticality of an anomaly in a device battery.

The invention relates to systems in which a plurality of device batteries are monitored by a device-external central processing unit. The invention further relates to methods for detecting an anomaly in a device battery and determining its criticality.

The supply of energy to network-independently operated electrical devices and machines, such as electrically drivable motor vehicles, as a rule takes place by means of device batteries or vehicle batteries. The latter supply electrical energy for operating the devices.

Device batteries degrade over their service life and as a function of their load or usage. This so-called aging leads to a continuously decreasing maximum power or storage capacity. The aging state corresponds to a measure for indicating the aging of energy stores. In accordance with the convention, a new device battery can have a 100% aging state (regarding its capacity, SOH-C) which increasingly decreases over the course of its service life. A degree of aging of the device battery (change in the aging state over time) depends on an individual load on the device battery, i.e., in the case of vehicle batteries of motor vehicles, on the usage behavior of a driver, external ambient conditions and on the type of vehicle battery.

In order to monitor device batteries from a plurality of devices, operating value data is typically continuously captured and, as operating value profiles, are transmitted in block fashion to an in-device central processing unit. In the case of device batteries having a plurality of battery cells, the operating values can be captured at the cell level and transmitted to the central processing unit, in particular in compressed form. To evaluate the operating value data, in particular to determine aging states in models based on differential equations, the operating value data is scanned with a comparatively high temporal resolution (scanning frequencies) of, for example, between 1 and 100 Hz and an aging state is determined therefrom using a time integration method.

In addition to age-based degradation, device batteries can experience errors due to a variety of causes that can result in faster aging or sudden failure of the device battery. These failures and errors of device batteries and individual battery cells are often discernible in advance by changes in battery behavior and can be detected as a result.

In order to increase the acceptance of device batteries, it is necessary to ensure their safety, durability, performance, and reliable operation. For this purpose, it is important to carefully monitor battery performance. This is usually done using anomaly detection methods, which can detect deviations from normal operation of the device batteries and can also determine the criticality and/or cause of the abnormalities. Existing methods focus on an estimation of the state of aging or a prediction of the state of aging, which, however, depends significantly on a recognition of the behavior of the type of battery in question. However, if there is no suitable model for mapping the battery behavior, a detection of an anomaly in the battery behavior is difficult.

SUMMARY OF THE INVENTION

According to the invention, there is provided a method for detecting an error type in a device battery for a technical device as well as a corresponding apparatus Further configurations are specified in the dependent claims.

According to a first aspect, a method for monitoring a device battery for the presence of an anomaly in the battery operation is provided, having the following steps:

providing temporal operational variable profiles of operational variables for the device battery;

determining an input dataset of operational characteristics for a historical evaluation period;

using an anomaly detection model with an encoder/decoder model to determine a reconstruction error for the input dataset, wherein the encoder/decoder model is trained with input datasets of device batteries of normal function in order to map an input dataset onto an input dataset that is reconstructed as identically as possible;

When a reconstruction error is found to be above a specified anomaly threshold, determining at least one rule-based criticality value as a function of one or more characteristic-based criticality values, which depend on or correspond to a reconstruction error based on a characteristic, and at least one predetermined rule, wherein the at least one predetermined rule considers one or more of the characteristic-based criticality values and specifies a criterion for the presence of an error mode, which depends on the one or more characteristic-based criticality values;

signaling the corresponding error type as a function of the at least one rule-based criticality value.

In particular, the corresponding error type can be signaled when the at least one rule-based criticality value is above a specified criticality value threshold.

One idea of the above method is to provide an anomaly detection model that is trained on a plurality of training datasets that are substantially indicative of normal battery behavior and have been determined from historical data of the battery operation or from batteries of the same type.

The training datasets can include aggregated data and the like, respectively, from raw data of operational variable profiles or pre-processed operational variable profiles or operational characteristics derived therefrom for certain periods of time (scaling, windowing, aggregation).

The anomaly detection model is trained with training datasets, respectively, such that they are mapped onto themselves.

The encoder/decoder model can comprise a data-based encoder model, which is configured as a dimension-reducing deep neural network or PCA model, and a data-based decoder model, which is configured as a dimension-extending deep neural network, wherein the encoder/decoder model is or becomes trained with training datasets that represent the input datasets for a properly functioning device battery.

Thus, the anomaly detection model can be configured as an encoder/decoder model in a data-based manner. A data-based encoder model of the encoder/decoder model maps an input dataset having the format of a training dataset onto a dimension-reduced state vector, which is mapped from a data-based decoder model into the reconstructed input dataset as far as possible. The encoder/decoder model training is performed by minimizing the reconstruction error across all training datasets, which can be defined as the sum of the distances (L2 norm) of the input dataset and the reconstructed input dataset.

With the aid of the thusly trained encoder/decoder model, on the one hand an anomaly can now be detected in the operation of the device battery, and on the other hand a criticality of the found anomaly and, if applicable, a cause of the anomaly can be detected. By monitoring the operation of the device battery by capturing the operational quantity data and determining the data required for the format of the input dataset, an individual reconstruction error can be determined using the anomaly detection model.

The anomaly detection model is trained assuming that the available training datasets represent the substantial operational variable profiles of equipment batteries with proper function. The anomaly detection model configured as an encoder/decoder model is thus trained to represent the distribution in the multi-dimensional input data space. The reconstruction error correspondingly indicates a distance of input datasets determined from the operation of the device battery from this distribution, and, for example, a threshold comparison can determine an abnormality at too large a distance (deviation) from the distribution of the normal data of the training datasets.

The criticality of the found anomaly can be determined based on one or more characteristic-based criticality values for one or more operational characteristics of the input dataset. The criticality is measured on the basis of one or more characteristic-based criticality values determined from a characteristic-based reconstruction error, i.e., a distance between an element value of an element of the input dataset and an element value of a corresponding element of the reconstructed input dataset, and in particular its distribution in the proper case of the device battery in question.

Furthermore, the criticality value can be determined as a rule-based criticality value from one or more characteristic-based criticality values, in particular as a mean value, median value, or the like, wherein the characteristic-based criticality values in particular correspond to normalized characteristic-based reconstruction errors.

In particular, the characteristic-based criticality value for an operational characteristic can be determined from the input dataset by specifying an upper and lower reconstruction error threshold and an anticipated value for the characteristic-based reconstruction error of the relevant operational characteristic, and wherein the characteristic-based reconstruction error is normalized to the reconstruction error thresholds and the anticipated value.

In particular, the upper and lower reconstruction error threshold can be determined as specified quantile values of characteristic-based reconstruction errors from an evaluation of specified training datasets for the anomaly detection model and the anticipated value is determined as the mean value of the characteristic-based reconstruction errors.

To account for distribution in the proper case, an upper and lower reconstruction error threshold can be defined for each of the operational characteristics of the input dataset. With regard to these reconstruction error thresholds, the characteristic-based criticality value for the relevant characteristic can be normalized according to the distance of the characteristic-based reconstruction error from the reconstruction error thresholds or from the closest reconstruction error threshold, respectively.

Using a rule-based system, the characteristic-based criticality values can be evaluated so as to determine rule-based criticality values. The rule-based criticality values can be determined from aggregated characteristic-based criticality values for each selected operational characteristic. For example, the rule-based criticality values can each be determined from the mean value of the characteristic-based criticality values associated with the rule for the operational characteristics that are generally considered.

For example, a rule that can detect an abnormality due to rapid aging can be based on a characteristic that depends on the histogram that senses the state of charge against the temperature and energy conversion (Ah throughput). For example, the rules for determining the rule-based criticality values can be defined with threshold comparisons and additional domain-specific formulas.

The rule-based criticality value can now be evaluated using a threshold comparison in order to detect whether the detected anomaly is critical or non-critical and with what possible error mode it is associated.

Furthermore, an anomaly is detected when a reconstruction error can be detected above the specified anomaly threshold, wherein the frequency of performing the anomaly monitoring of one of the fraction of anomalies detected with respect to all anomalies of the anomaly monitoring is determined.

According to a further aspect, an apparatus for carrying out one of the above methods is provided.

BRIEF DESCRIPTION OF THE DRAWINGS

Embodiments are described in further detail below with reference to the accompanying drawings. The figures show.

DETAILED DESCRIPTION

In the following, the method according to the invention is described with reference to vehicle batteries as device batteries in a plurality of motor vehicles as similar devices. To this end, one or more anomaly detection models are operated in the central processing unit and used for anomaly location. In the central processing unit, the anomaly detection model is continuously updated or re-trained based on operating values of the vehicle batteries from the vehicle fleet.

The example above is representative of a plurality of stationary or mobile devices with a network-independent energy supply, such as vehicles (electric vehicles, pedelecs, etc.), systems, machine tools, household appliances, IOT devices, and the like, which are connected via a corresponding communication connection (e.g., LAN, Internet) to a device-external central processing unit (Cloud).

Figure 1:
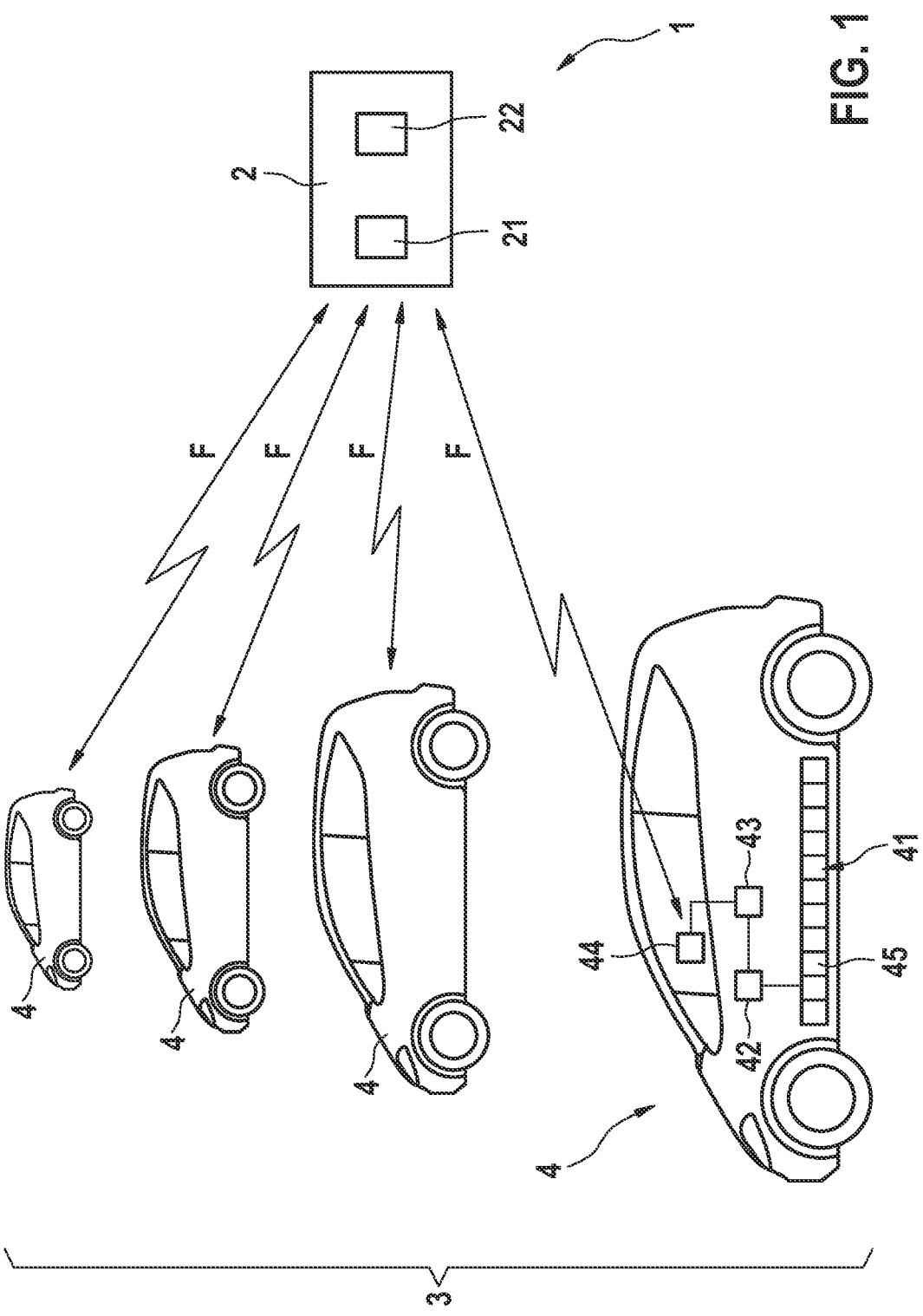
FIG. 1 a schematic view of a system for providing battery-based operational quantities for evaluation in a central processing unit.

FIG. 1 shows a system 1 for collecting fleet data of a vehicle fleet in a central processing unit 2 for creating and for operating as well as for evaluating an anomaly detection model. The anomaly detection model is used in order to detect and identify an anomaly when operating battery cells of the vehicle battery in a motor vehicle. FIG. 1 shows a vehicle fleet 3 with a plurality of motor vehicles 4.

One of the motor vehicles 4 is shown in more detail in FIG. 1. The motor vehicles 4 each comprise a vehicle battery 41, an electric drive motor 42, and a control unit 43. The control unit 43 is connected to a communication system 44, which is suitable for transmitting data between the respective motor vehicle 4 and a central processing unit 2 (a so-called cloud).

The vehicle battery 43 includes a plurality of battery cells 45 that are to be monitored for anomalies according to methods described below.

The controller 43 is in particular configured to provide data for selected, selectable, or all battery cells 45 having a high temporal resolution, such as between 1 and 50 Hz, such as e.g., 10 Hz, and transmits such to the central processing unit 2 via the communication device 44.

The motor vehicles 4 send the operating values F to the central processing unit 2, which indicate at least values that affect the aging state of the vehicle battery 41, and which are required for a determination of internal states of the battery cells 45. In the case of a vehicle battery 41, the operating values F can indicate an instantaneous battery current, an instantaneous battery voltage, an instantaneous battery temperature and an instantaneous state of charge (SOC), at the pack, module and/or cell level.

The operating variables F are sensed as the operational variable profiles in a fast time grid from 0.1 Hz to 50 Hz and can be transmitted regularly to the central processing unit 2 in uncompressed and/or compressed form. For example, by using compression algorithms, the time series can be transmitted to the central processing unit 2 in blocks at intervals of 10 min to several hours in order to minimize the data traffic to the central processing unit 2.

The central processing unit 2 comprises a data processing unit 21, in which the method described below can be performed, and a database 22 for storing data points, model parameters, states, and the like.

In the central processing unit 2, an anomaly detection model is implemented, which is configured as an encoder/decoder model in a data-based manner. The encoder/decoder model can be used regularly, e.g., after the respective evaluation time period has elapsed, in order to detect the presence of an anomaly in the battery operation based on operating characteristics determined from the time profiles of the operational quantities (e.g., respectively since the respective vehicle battery has been commissioned).

The central processing unit 2 is configured so as to receive the operational variable profiles and evaluate them for each vehicle 4 or each vehicle battery 41 using the anomaly detection model.

Figure 2:
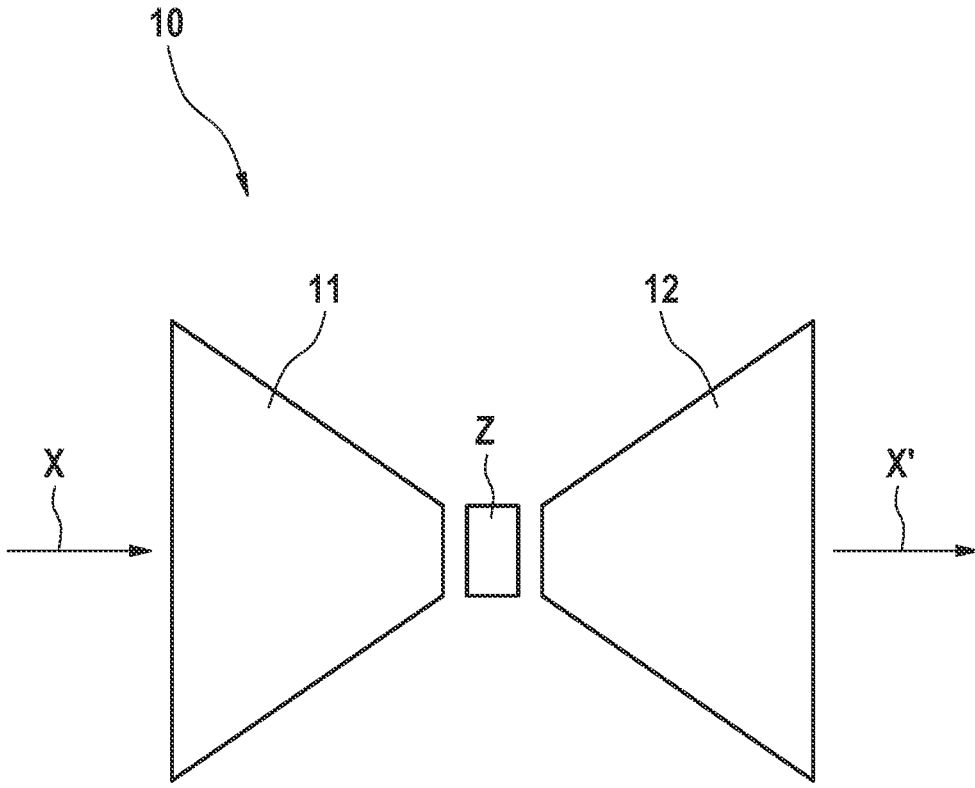
FIG. 2 an exemplary view of an encoder/decoder model of the anomaly detection model.

An exemplary anomaly detection model 10 is schematically shown in FIG. 2. For example, the anomaly detection model 10 can be formed in the form of an auto-encoder having an encoder model 11 in the form of a dimension-reducing deep neural network and a decoder model 12 in the form of a dimension-enhancing deep neural network. The encoder model 11 performs a dimensional reduction of an input dataset X provided from operational characteristics $x_1$, $x_2$, . . . , $x_n$, and/or other data derived from operational variable profiles, and maps a dimension-reduced state vector Z onto the input dataset. The state vector is now converted into a reconstructed input dataset X' using the decoder model 12.

The anomaly detection model can have a neural network or other data-based model as encoder model 11, or alternatively it can have a PCA (Principal Component Analysis) model.

The training of the anomaly detection model 10 is done via a minimization of the reconstruction error, which can be determined, for example, via all training datasets using an L2 norm:

$$MSE = \frac{1}{N}\sum e$$

$$e = \sqrt{e_1^2 + \ldots + e_n^2}, \quad e_i = x_i' - x_i$$

With $X = [x_1, x_2, x_3, \ldots x_n]^T$ and $X' = [x_1', x_2', x_3', \ldots x_i']^T$ With $X=[x_1, x_2, x_3, \ldots x_n]^T$ and $X'=[x'_1, x'_2, x'_3, \ldots, x'_i]^T$ The data-based models of the encoder model 11 and the decoder model 12 are trained accordingly in order to minimize the reconstruction error MSE.

To evaluate the anomaly detection model, the operational variable profiles are converted into a corresponding input dataset X, in particular by generating the corresponding operational characteristics for a specific evaluation window and evaluating them using the anomaly detection model. The reconstructed input dataset X' is evaluated with respect to the reconstruction error, which serves as the anomaly measure s.

$$s = MSE(g(f(x_1, x_2, x_3, \ldots x_n)))$$

The larger the anomaly measure, the greater the distance of the current battery state of the vehicle battery 41 from the data points previously determined by the training datasets. Thus, high anomaly measures above a specified anomaly threshold are considered an anomaly.

Figure 3:
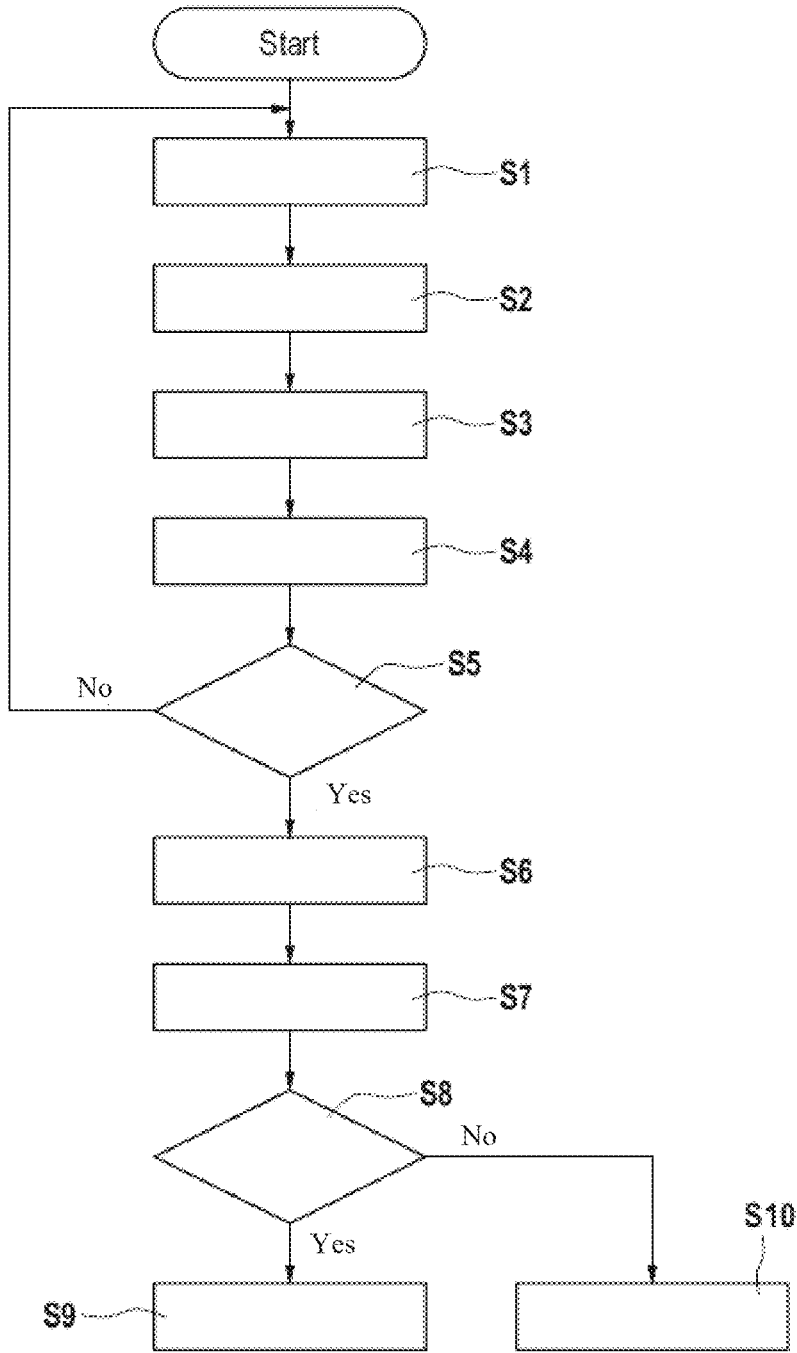
FIG. 3 a flow chart illustrating a method for detecting an evaluation of an anomaly of a vehicle battery.

FIG. 3 shows a flow chart illustrating a method for detecting and evaluating an anomaly of a vehicle battery 41. The method is preferably performed in a central processing unit 2 communicatively connected to a plurality of vehicles 4.

In step S1, the operational variable profiles F of a device battery to be monitored are first recorded, in particular in the central processing unit 2 and, in step S2, operational characteristics are determined at a specified evaluation time and for a specified evaluation period of e.g., one to several hours, a day, or the like, in order to generate an input dataset X of a format, as used for training datasets. The operating characteristics generated from the operational variable profiles can, for example, comprise characteristics relating to the evaluation period and/or accumulated characteristics and/or statistical variables determined over the entire previous service life. In particular, the operating characteristics contain for example: electrochemical states, such as SEI layer thickness, change of cyclable lithium due to anode/cathode side reactions, rapid absorption of electrolyte solvent, slow absorption of electrolyte solvents, lithium deposition, loss of active anode material and loss of active cathode material, information on impedances or the internal resistances, histogram characteristics, such as temperature over state of charge, charging current over temperature and discharging current over temperature, in particular multi-dimensional histogram data with respect to the battery temperature distribution over the state of charge, the charging current distribution over the temperature and/or the discharging current distribution over the temperature, the current flow rate in ampere-hours, the accumulated total charge (Ah), a mean value increase in capacity during a charging operation (in particular for charging operations in which the charge increase is above a threshold fraction [e.g., 20% ΔSOC] of the total battery capacity), the charging capacity as well as an extreme value (e.g., maximum) of the differential capacity during a measured charging operation with sufficiently large stroke of the state of charge (smoothed profile of dQ/dU: charge change divided by change in the battery voltage) or the accumulated driving power.

In step S3, the thusly determined input dataset X is evaluated at the predetermined evaluation time with the anomaly detection model 10 in order to obtain a reconstructed input dataset X'.

In step S4, a reconstruction error is determined by detecting the reconstructed input dataset X' and by determining the distance between the input dataset X and the reconstructed input dataset X', in particular using an L2 norm. The reconstruction error corresponds to an anomaly measure.

The analysis period or the time interval between the analyses of this method for anomaly monitoring can be determined as a function of the amount of the anomaly measure of the last analysis or the last analyses. To this end, the anomaly measures/reconstruction errors can each be compared to a specified anomaly threshold value for a specified number or a specified period, and an anomaly can be detected upon exceeding the anomaly threshold for the anomaly measure. The number of abnormalities detected based on the total number of evaluations monitored provides an anomaly fraction that indicates a frequency of abnormalities that occurred. For example, if the anomaly fraction is below 5%, the anomaly monitoring can be performed once a week, if the anomaly fraction is between 5% and 25%, it can be performed daily, and if the abnormal fraction is above 25%, anomaly monitoring can be performed every minute.

In step S5, it is checked whether the reconstruction error is above a specified anomaly threshold. If it is determined that the reconstruction error is above a specified anomaly threshold (alternative: Yes), the method is continued with step S6, otherwise (alternative: No), it is returned to step S1.

In step S6, characteristic-based criticality values are determined that result from the evaluation of the individual operating characteristics of the input dataset. For this purpose, an upper and a lower reconstruction error threshold are determined for each of the operational characteristics of the input dataset. The reconstruction error thresholds are selected such that, in the range between upper and lower reconstruction error thresholds, a predetermined fraction of the characteristic-based reconstruction errors lies. A characteristic-based reconstruction error is the distance between the element value of the relevant operational characteristic in the input dataset X and the element value of the corresponding operational characteristic in the reconstructed input dataset X'. For example, the upper and lower reconstruction error threshold can be determined by corresponding evaluation with the training datasets for the anomaly detection model 10. For this purpose, after training the anomaly detection model 10, the training datasets are used in order to determine the distribution of the corresponding characteristic-based reconstruction error. For example, the upper and lower reconstruction error threshold result as the 1% and 99% quantile of the distribution of the characteristic-based reconstruction errors of the corresponding operational characteristic, or as other specified quantile values. In this way, a lower and upper reconstruction error threshold can be determined for each of the operational characteristics in the input dataset. Thus, the characteristic-based reconstruction error $e_i$ is between the respective upper and lower reconstruction error threshold $$e_i^{max}, e_i^{min}$$

$$e_i^{min} < e_i < e_i^{max}$$

The following formulas are used in order to determine characteristic-based criticality values $h_i$, wherein $Ee_i$ $h_i$ corresponds to the anticipated value of the characteristic-based reconstruction error as described above, for which:

$$e_i^{min} < Ee_i < e_i^{max}$$

$$\text{If } e_i > Ee_i, \text{ then } h_i = (e_i - Ee_i)/(e_i^{max} - Ee_i)$$

$$\text{If } e_i = <Ee_i, \text{ then } h_i = (e_i - Ee_i)/\left(e_i^{min} - Ee_i\right)$$

If $e_i > Ee_i$, then $h_i = (e_i - Ee_i)/(e_i^{max} - Ee_i)$

If $e_i = <Ee_i$, then $h_i = (e_i - Ee_i)/(e_i^{min} - Ee_i)$

Subsequently, in step S7, rule-based criticality values $r_j$ (j=1 . . . m, m number of specified rules) are now determined based on the characteristic-based criticality values $h_i$ for each operational characteristic in the input dataset. Rules are specified for this purpose that respectively consider the characteristic-based criticality values $h_i$ of a selection of operational characteristics. These represent an aggregation of selected characteristic-based criticality values $h_i$ with respect to selected operational characteristics in the input data dataset. The aggregation of the characteristic-based criticality values can be carried out by means of mean value formation, maximum value formation, or other calculation procedures.

For example, operating characteristics that characterize the state of charge over the temperature histogram and indicate an ampere hourly flow rate can be considered, and their criticality values $h_i$ are averaged in order to obtain a rule-based criticality value r. This can be compared in step S8 using a threshold comparison with a specified criticality value threshold $r_{thr}$. If it is determined that the rule-based criticality value r is above the predetermined criticality threshold (alternative: Yes), then in step S9 the detected anomaly is recognized as severe and signaled in a suitable manner, otherwise (alternative: No) in step S10 the detected anomaly is considered less severe and ignored or signaled in a corresponding manner.

A plurality of rules can be provided, each of which can be associated with a particular error cause. In this way, it is possible to assess the occurrence of an anomaly with respect to the cause of the error and the level of criticality with the above procedure.

The invention claimed is:

1. A method for monitoring a device battery (41) for a presence of an anomaly in a operation of the device battery (41), the method comprising:

providing (S1) temporal operational variable profiles (F) of operational variables for the device battery (41);

determining (S2), via a computer, an input dataset (X) of operational characteristics for a historical evaluation period as a function of the temporal operational variable profiles (F);

using (S3, S4), via the computer, an anomaly detection model (10) with an encoder/decoder model to determine a reconstruction error (e) for the input dataset (X), wherein the encoder/decoder model is trained with input datasets (X) of device batteries (41) of normal function in order to map an input dataset (X) onto an input dataset (X') that is reconstructed as identically as possible;

when a reconstruction error (e) is found to be above a specified anomaly threshold (S5), determining (S6, S7), via the computer, at least one rule-based criticality value (r) as a function of one or more characteristic-based criticality values ($h_i$), which depend on or correspond to a reconstruction error ($e_i$) based on a characteristic, and at least one predetermined rule, wherein the at least one predetermined rule considers one or more of the characteristic-based criticality values ($h_i$) and specifies a criterion for a presence of an error mode, which depends on the one or more characteristic-based criticality values ($h_i$); and signaling (S9, S10), via the computer, a corresponding error type as a function of the at least one rule-based criticality value (r).

2. The method according to claim 1, wherein the rule-based criticality value (r) is determined from one or more characteristic-based criticality values ($h_i$) specified by the corresponding rule, and wherein the characteristic-based criticality values ($h_i$) correspond to normalized characteristic-based reconstruction errors ($e_i$).

3. The method according to claim 2, wherein the characteristic-based criticality value ($h_i$) for an operational characteristic is determined from the input dataset by specifying an upper and lower reconstruction error threshold $$\left(e_i^{max}, e_i^{min}\right)$$

and an anticipated value for a characteristic-based reconstruction error ($e_i$) of the characteristic-based reconstruction errors ($e_i$) of a relevant operational characteristic, and wherein the characteristic-based reconstruction error ($e_i$) is normalized to the reconstruction error thresholds and the anticipated value.

4. The method according to claim 3, wherein the upper and lower reconstruction error threshold $$\left(e_i^{max}, e_i^{min}\right)$$

is determined as specified quantile values of the characteristic-based reconstruction errors ($e_i$) from an evaluation of specified training datasets for the anomaly detection model (10) and the anticipated value is determined as the mean value of the characteristic-based reconstruction errors ($e_i$).

5. The method according to claim 1, wherein the encoder/decoder model comprises a data-based encoder model (11), which is configured as a dimension-reducing deep neural network or PCA model, and a data-based decoder model (12), which is configured as a dimension-extending deep neural network, wherein the encoder/decoder model is or becomes trained with training datasets that represent the input datasets for a properly functioning device battery (41).

6. The method according to claim 1, wherein an anomaly is detected when a reconstruction error (e) is detected above the specified anomaly threshold, wherein the frequency of performing the anomaly monitoring is determined in order to find one of a fraction of anomalies detected with respect to all anomalies of the anomaly monitoring.

7. A computer configured to monitor a device battery (41) for a presence of an anomaly in an operation of the device battery (41), by:

obtaining (S1) temporal operational variable profiles (F) of operational variables for the device battery (41);

determining (S2) an input dataset (X) of operational characteristics for a historical evaluation period as a function of the temporal operational variable profiles (F);

using (S3, S4) an anomaly detection model (10) with an encoder/decoder model to determine a reconstruction error (e) for the input dataset (X), wherein the encoder/decoder model is trained with input datasets (X) of device batteries (41) of normal function in order to map an input dataset (X) onto an input dataset (X') that is reconstructed as identically as possible;

when a reconstruction error (e) is found to be above a specified anomaly threshold (S5), determining (S6, S7) at least one rule-based criticality value (r) as a function of one or more characteristic-based criticality values ($h_i$), which depend on or correspond to a reconstruction error ($e_i$) based on a characteristic, and at least one predetermined rule, wherein the at least one predetermined rule considers one or more of the characteristic-based criticality values ($h_i$) and specifies a criterion for a presence of an error mode, which depends on the one or more characteristic-based criticality values ($h_i$); and signaling (S9, S10) a corresponding error type as a function of the at least one rule-based criticality value (r).

8. A non-transitory, computer-readable storage medium containing instructions which, when executed by the computer, cause the computer to monitor a device battery (41) for a presence of an anomaly in an operation of the device battery (41), by:

obtaining (S1) temporal operational variable profiles (F) of operational variables for the device battery (41);

determining (S2) an input dataset (X) of operational characteristics for a historical evaluation period as a function of the temporal operational variable profiles (F);

using (S3, S4) an anomaly detection model (10) with an encoder/decoder model to determine a reconstruction error (e) for the input dataset (X), wherein the encoder/decoder model is trained with input datasets (X) of device batteries (41) of normal function in order to map an input dataset) onto an input dataset that is reconstructed as identically as possible;

when a reconstruction error (e) is found to be above a specified anomaly threshold (S5), determining (S6, S7) at least one rule-based criticality value (r) as a function of one or more characteristic-based criticality values ($h_i$), which depend on or correspond to a reconstruction error ($e_i$) based on a characteristic, and at least one predetermined rule, wherein the at least one predetermined rule considers one or more of the characteristic-based criticality values ($h_i$) and specifies a criterion for a presence of an error mode, which depends on the one or more characteristic-based criticality values ($e_i$); and signaling (S9, S10) a corresponding error type as a function of the at least one rule-based criticality value (r).

* * * * *